United States Patent
Yang et al.

(10) Patent No.: US 7,781,011 B2
(45) Date of Patent: Aug. 24, 2010

(54) TOOL FOR COATING AN OPTICAL DISC, METHOD OF COATING AN OPTICAL DISC, AND METHOD FOR FABRICATING AN OPTICAL DISC

(75) Inventors: Ting-Wei Yang, Hsinchu (TW); Chi-Pin Kuo, Hsinchu (TW)

(73) Assignees: Princo Corp., Hsinchu (TW); Princo America Corp., Fremont, CA (US)

( * ) Notice: Subject to any disclaimer, the term of this patent is extended or adjusted under 35 U.S.C. 154(b) by 5 days.

(21) Appl. No.: 12/101,995

(22) Filed: Apr. 13, 2008

(65) Prior Publication Data

US 2009/0092750 A1    Apr. 9, 2009

(30) Foreign Application Priority Data

Oct. 4, 2007    (TW) ............................... 96137349 A

(51) Int. Cl.
*B05D 1/40* (2006.01)
*B05D 1/42* (2006.01)

(52) U.S. Cl. .................. 427/162; 427/240; 427/355; 427/356; 427/358; 118/232; 118/256

(58) Field of Classification Search ................. 427/162, 427/240, 355, 356, 358; 118/232, 256, 258, 118/244
See application file for complete search history.

(56) References Cited

U.S. PATENT DOCUMENTS

| | | | |
|---|---|---|---|
| 5,219,615 A * | 6/1993 | Nakazawa et al. | 427/240 |
| 5,655,948 A | 8/1997 | Yapel | |
| 5,935,331 A * | 8/1999 | Naka et al. | 118/319 |
| 6,077,349 A | 6/2000 | Kikuchi | |
| 6,191,053 B1 * | 2/2001 | Chun et al. | 438/780 |
| 7,138,016 B2 | 11/2006 | Reardon et al. | |
| 2005/0175771 A1 | 8/2005 | Hisada | |

* cited by examiner

*Primary Examiner*—Kirsten C Jolley
(74) *Attorney, Agent, or Firm*—Pai Patent & Trademark Law Firm; Chao-Chang David Pai

(57) ABSTRACT

The invention relates to a tool for coating an optical disc, and the tool includes: a coating section for spreading coating material; a restricting section for defining a coating area; and a support section for supporting the coating section and the restricting section. The coating section and the restricting section form a material accommodating space. Also, a method for coating an optical disc by using such tool and a method for fabricating an optical disc are disclosed.

10 Claims, 3 Drawing Sheets

TOOL FOR COATING AN OPTICAL DISC, METHOD OF COATING AN OPTICAL DISC, AND METHOD FOR FABRICATING AN OPTICAL DISC

BACKGROUND OF THE INVENTION a) Field of the Invention

The invention relates to a tool for coating an optical disc, a method for coating an optical disc, and a method for fabricating an optical disc. More particularly, the invention relates to a tool for coating an optical disc, a method for coating an optical disc, and a method for fabricating an optical disc that are adaptable to forming a thick annular coating layer with uniform thickness defined within a desired coating area when using a highly viscous coating material.

b) Description of Related Art

Coating an optical disc to form a flat coating layer thereon is an important step in fabricating an optical disc. Conventional coating methods include sputtering, spin-coating, printing, chemical vapor deposition and so on. However, each of the conventional methods has limitations on its utilization.

Spin-coating is a process in which an optical disc substrate is rotated at a higher rotation speed of 100 rpm to 8000 rpm to spread out and uniformly distribute coating material on the optical disc substrate. The advantage of such method is that a coating layer with uniform thickness can be obtained. Although a thickness more than 100 μm can be formed by spin-coating in special processes, a coating layer formed with viscous coating material may have uneven thickness or severe water ripples because viscous coating material cannot be spread evenly on the optical disc substrate by spin-coating. When the viscosity of coating material is greater than 10000 cps, such coating material cannot be spun so as to be spread. Also, since the substrate to be coated must be rotated at a high rotation speed between 100 rpm and 8000 rpm to perform spin-coating, spin-coating cannot be used to form a coating layer on a substrate that is unsuitable for high-speed rotation. In addition, when performing spin-coating, a part of the coating material is spun over and out of the optical disc substrate region, thus causing a waste of coating material or a problem where waste material must be recycled.

As for sputtering, printing, and chemical vapor deposition, although viscous coating material may be used, a coating layer with thickness greater than 0.1 mm is difficult to form, or the flatness of the formed coating layer with high thickness is poor. For instance, when performing vacuum sputtering, only a coating layer with thickness less than 10 μm can be formed. Common printing methods like relief printing, intaglio printing, and offset printing can form a coating layer with thickness less than 20 μm only. Screen printing can form a coating layer with thickness of approximately 100 μm, but the usage of this method is limited to an object that has no protruding portion. For example, if an optical disc substrate that is to be coated has a thick supporting portion at the central part of the substrate, making the central supporting portion to be protruded, then the method of screen printing cannot be employed to form a coating layer. Moreover, besides printing methods, most of the remaining methods would have difficulty in defining a coating area, like forming an annular coating layer with predetermined width on an annular substrate. Furthermore, scraping technique is in general applied in coating the entirety of larger area, so excess coating material is likely to be scraped off in operation, and thus a waste of coating material is inevitable and limiting the coating area, like forming an annular coating layer, is difficult.

It is not easy to find an appropriate coating method to form, on an optical disc substrate, a uniform annular coating layer with large thickness by using coating material having higher viscosity while defining the coating area to save cost of coating material.

BRIEF SUMMARY OF THE INVENTION

In view of the limitations of the aforementioned methods, the invention discloses a tool for coating an optical disc and a method for coating an optical disc that are suitable for applying viscous material on an optical disc to form a thick and even annular coating layer. The tool and method of the invention can define a coating area and prevent waste of coating material.

The invention provides a tool for coating an optical disc, which includes: a coating section having an upper surface and a coating surface for spreading coating material; a restricting section for defining a coating area on an optical disc substrate, comprising a first blocking portion having a first outside surface and a second blocking portion having a second outside surface, the restricting section forming; and a support section for supporting the coating section and the restricting section. The coating section is of a scraper structure and is used to spread the coating material on the optical disc substrate to form a coating layer having uniform thickness. The first and the second blocking portions of the restricting section are separately coupled to two opposite sides of the coating section, each extending by a desirable length in a downward direction substantially perpendicular to the upper surface of the coating section, and the first outside surface, the second outside surface, and the coating surface of the coating section are coplanar. The material accommodating space is of a structure having a U-shaped cross-section and it can be used to define the coating area on the optical disc substrate and store the coating material during the coating process to avoid wasting of the coating material. The support section has a plurality of mounting holes and is connected to a driving device to move and/or rotate the tool for coating an optical disc.

The invention also provides a method for coating an optical disc, which includes steps of: placing coating material on an optical disc substrate having a central supporting portion or in a tool for coating an optical disc of the invention; positioning the tool for coating an optical disc so that a coating surface of the tool is parallel to a to-be-coated surface of the optical disc; generating a relative motion between the tool for coating an optical disc and the optical disc substrate; utilizing the tool for coating an optical disc to spread the coating material on the optical disc substrate; and forming an annular coating layer on the optical disc substrate. The method is suitable for working with coating material having a viscosity greater than 10000 cps and is capable of forming a flat coating layer with a high thickness that is greater than 0.1 mm.

In the placing step, the amount of coating material placed on the optical disc substrate is predetermined according to the size of a coating area needed to form a coating layer. The coating material is therefore not wasted and there is no remaining excess coating material to be recycled. In the generating step, the substrate on a turntable can be rotated at a rotation speed below 100 rpm, or it can remain still while the tool for coating an optical disc moves via a driving device at a rotation speed below 100 rpm along a circular track, or both the optical disc substrate and the tool for coating an optical disc rotate. Thus, the method is suitable for working with a substrate that can be rotated only at a low rotation speed. In addition, in this step, controlling the distance between the tool for coating an optical disc and the optical disc substrate ultimately controls the thickness of the coating layer formed thereby. In the utilizing step, the restricting section of the coating tool can contain the coating material within a coating area on the optical disc and direct the coating material to two routes such that a small portion of coating material closer to the center of the optical disc substrate is in contact with the supporting portion of the optical disc substrate for strengthening the structure of the optical disc.

The invention further provides a method for fabricating an optical disc, which includes steps of: fabricating an annular substrate, the annular substrate having a supporting portion and a recording portion surrounding the supporting portion, wherein the thickness of the supporting portion is larger than the thickness of the recording portion and the recording portion has a recording surface; forming a coating layer on the recording surface; and forming a damping layer on the coating layer by utilizing the tool for coating an optical disc and the method for coating an optical disc of the invention.

The tool for coating an optical disc and the method for coating an optical disc of the invention are suitable for forming an annular coating layer with high thickness on an optical disc using a high viscosity coating material. An optical disc formed by this method satisfies the standard specification for optical discs and has an excellent uniformity of thickness. Furthermore, the tool for coating an optical disc and the method for coating an optical disc of the invention provide an annular coating layer with desirable width according to a width requirement, in addition to having the advantage of material-saving.

DETAILED DESCRIPTION OF THE INVENTION

Figure 1A:
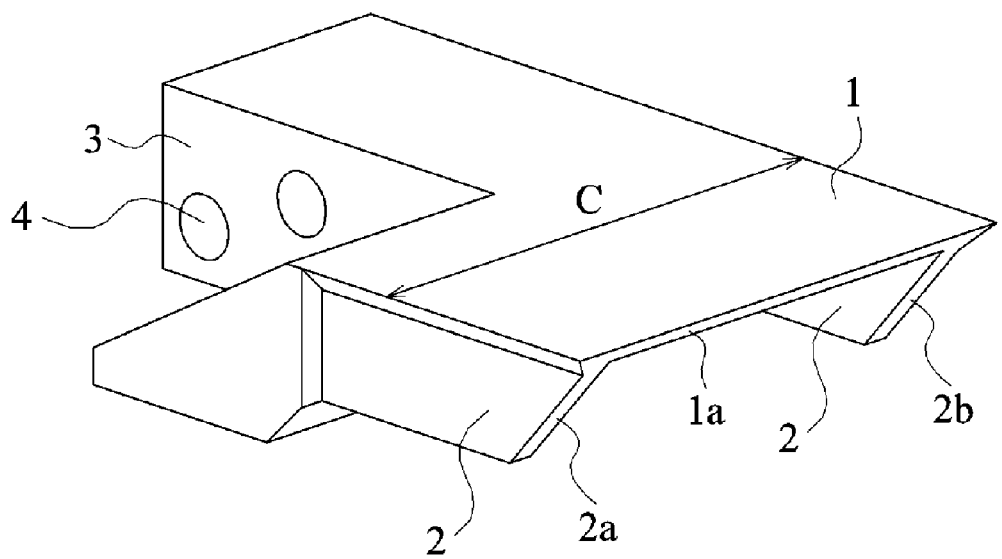
FIG. 1A is a perspective view of a tool for coating an optical disc according to an embodiment of the invention.

The preferred embodiments of a tool for coating an optical disc, a method for coating an optical disc, and a method for fabricating an optical disc according to the invention will be described in detail with reference to the drawings, in which like reference numerals denote like components.

Figure 1B:
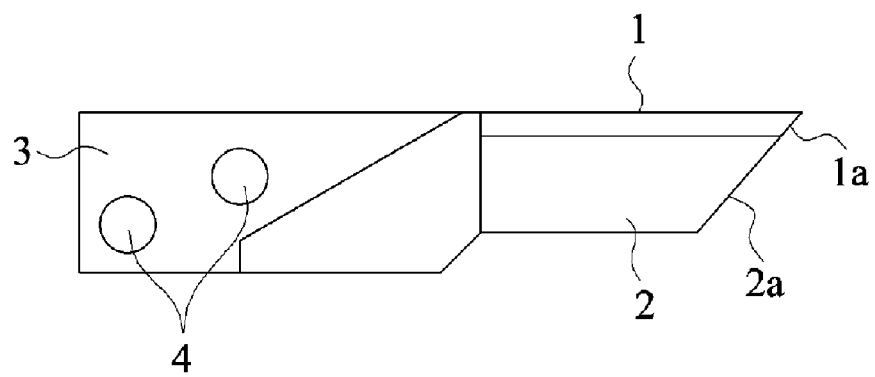
FIG. 1B is a side view of a tool for coating an optical disc according to an embodiment of the invention.
Figure 1C:
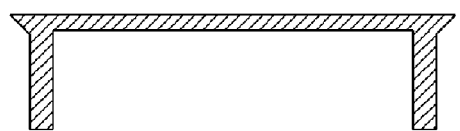
FIG. 1C is a side sectional view of a material accommodating space of a tool for coating an optical disc comprising two blocking portions therein according to another embodiment of the invention.

FIGS. 1A and 1B are, respectively, perspective view and side view of a tool for coating an optical disc according to an embodiment of the invention. As shown in FIG. 1A, a tool for coating an optical disc 11 includes: a coating section 1, a restricting section 2, and a support section 3, which can be formed integrally or by individual combination of these three sections. The coating section 1 has a substantial scraper structure for spreading coating material on an optical disc substrate, comprising an upper surface 1a' and a coating surface 1a, wherein the coating surface 1a is exactly the lower edge of the coating section 1 (scraper) that comes into contact with the coating material. More preferably, the coating surface 1a is inclined with respect to the upper surface 1a' of the coating section 1 at an angle. The tool 11 will make the inclined surface substantially parallel to the to-be-coated surface during the coating operation, so that the coating material can be spread over the substrate evenly. The restricting section 2 includes at least one blocking portion. In an embodiment of the invention, the restricting section 2 has only one blocking portion comprising a outside surface 2b. The only one blocking portion is coupled to the coating section 1 in the width direction C at one side farther away from the center of the to-be-coated substrate and extends by a desirable length in a downward direction substantially perpendicular to the upper surface 1a' of the coating section 1. Most preferably, in another embodiment of the invention, the restricting section 2 includes two blocking portions coupled separately to two opposite sides in the width direction C of the coating section 1 and extending by a desirable length in a downward direction substantially perpendicular to the upper surface 1a' of the coating section 1. In this embodiment, the two blocking portions are similar in shape, size, structure, and the desirable length extending downward. Besides, under the situation that the coating surface 1a is inclined with respect to the upper surface 1a of the coating section 1 at an angle, the outside surfaces 2a, 2b of the two blocking portions are also inclined with respect to the upper surface 1a of the coating section 1 at the same angle, such that the coating surface 1a, the outside surfaces 2a, 2b of the two blocking portions are coplanar during the coating operation. In other words, the coating section 1 and the two blocking portions of the restricting section 2 collectively form a structure having a U-shaped cross-section (as shown in FIG. 1C), namely a material accommodating space, and the width of which can be adjusted as desired and thus indicates the width of a coating area. It is noted that the two blocking portions can be different in shape, size, and structure, as long as the coating surface 1a of the coating section 1, outside surfaces 2a & 2b of the two blocking portions are coplanar, and the two blocking portions is capable of confining the coating material to the material accommodating space.

The support section 3 has a plurality of mounting holes 4 for connecting to a driving device like a mechanical arm, to support, move and/or rotate the coating section 1 and the restricting section 2. But the way of connection in the invention is not limited thereto. Whatever method of connecting the support section 3 with the coating section 1 such as clamping and welding can be used, as long as the support section 3 can achieve supporting and positioning the coating section 1 together with restricting section 2.

Figure 2:
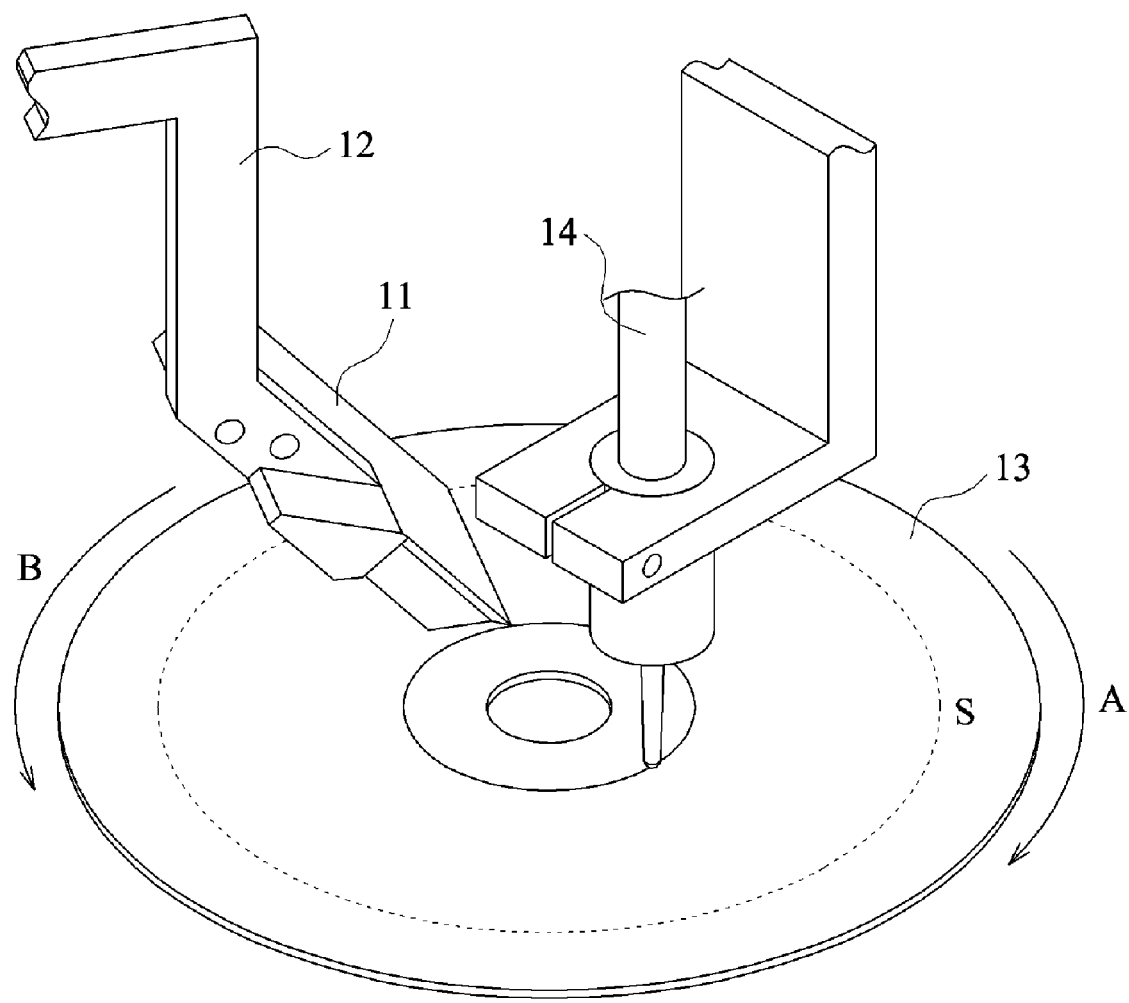
FIG. 2 is a schematic diagram illustrating the equipment for coating an optical disc according to further another embodiment of the invention.

The equipment for coating an optical disc according to an embodiment of the invention is illustrated in FIG. 2. The equipment includes a mechanical arm 12, the tool for coating an optical disc 11 fixed to the mechanical arm 12, a turntable (not illustrated), an optical disc substrate 13 having a supporting portion and a recording portion surrounding the supporting portion (not illustrated) on the turntable, and a material loading device 14. The material loading device 14 is used to place an appropriate amount of coating material (not illustrated) on a to-be-coated surface of the optical disc substrate 13. The surface of the recording portion is the to-be-coated surface.

Figure 3:
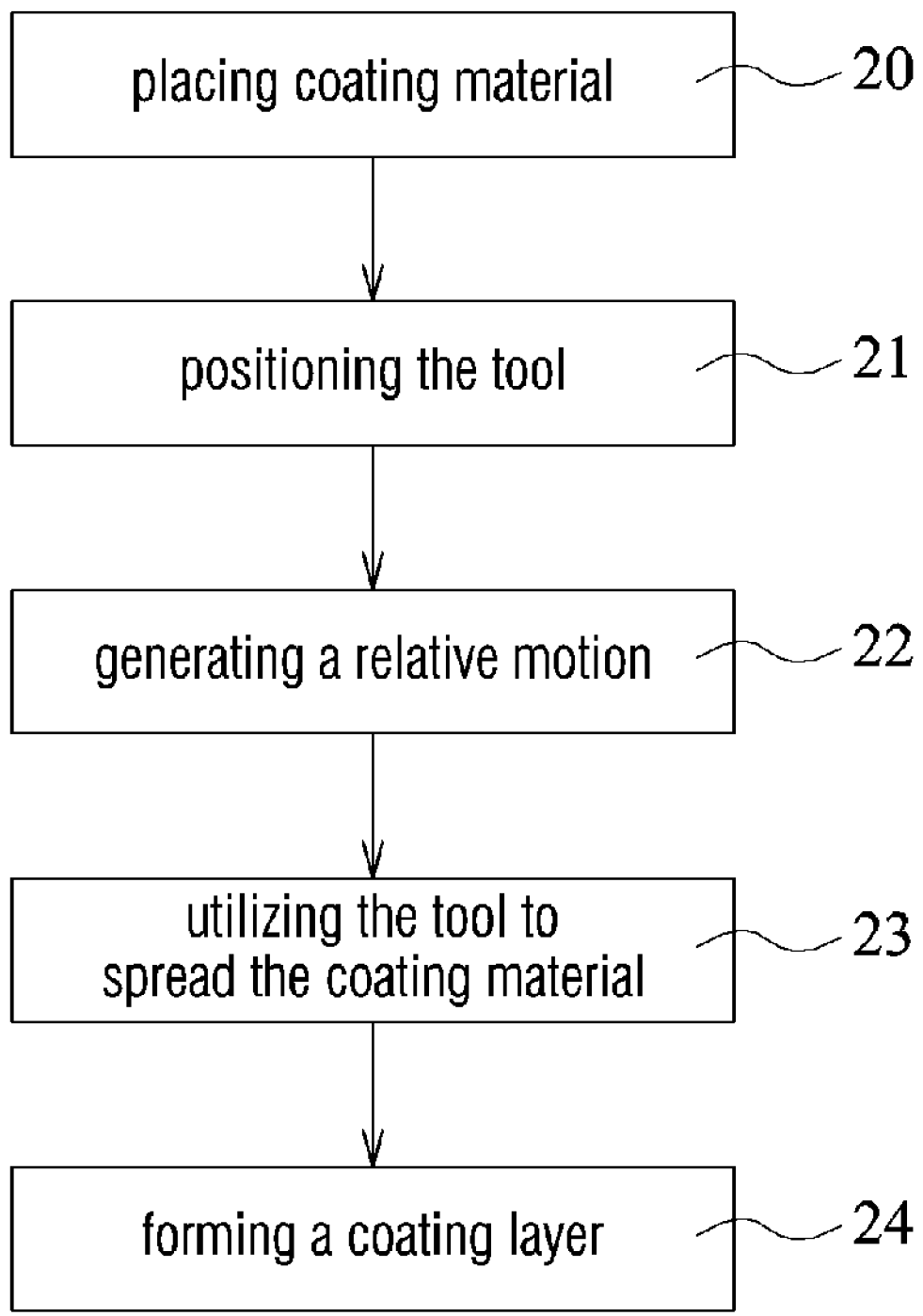
FIG. 3 is a flow chart illustrating a method for coating an optical disc according to an embodiment of the invention.

A method for coating an optical disc using the aforementioned coating equipment is described with reference to FIGS. 2 and 3. FIG. 3 is a flow chart illustrating the steps of coating an optical disc according to the invention.

Firstly, the material-loading device 14 places an appropriate amount of coating material on the to-be-coated surface of the optical disc substrate 13 at a position near the center of the optical disc substrate 13 (Step 20). The amount of the coating material loaded into the material-loading device 14 and then placed on the optical disc substrate 13 is predetermined based on the size of a coating area that is needed to form a coating layer. Taking the case of two blocking portions for the restricting section 2 as an example, none of the coating material is wasted because during the coating operation the coating material is retained within the material accommodating space of the tool for coating an optical disc 11 due to the blocking portions, while being slowly spread and distributed on the optical disc substrate 13.

Next, in the tool for coating an optical disc 11, the coating section 1 and the restricting section 2 are collectively moved and adjusted by, for example, a mechanical arm 12, to the extent that the coating surface 1a of the coating section 1, the outside surfaces 2a & 2b of the blocking portions are substantially parallel to the to-be-coated surface of the optical disc surface (Step 21). It will be appreciated that the coating section 1 (as well as the restricting section 2) only comes into contact with the coating material rather than the to-be-coated surface of the optical disc substrate 13. Afterwards, the optical disc substrate 13, carried by the turntable, rotates in a direction indicated by Arrow A of FIG. 2 at a low speed (Step 22). Alternatively, the tool 11 may rotate while the optical disc substrate 13 may remain motionless, as long as a relative motion therebetween can be created to facilitate spreading the coating material on the optical disc substrate 13. Due to the slow rotation of the optical disc substrate 13 in the direction indicated by Arrow A of FIG. 2, the coating material gradually distributes over the optical disc substrate 13, while the tool for coating an optical disc 11 comes in contact with the coating material thereon.

Then, the method goes to Step 23. In the case of only one blocking portion, it may be difficult in obtaining a well-controlled coating near the center (or the supporting portion, not shown) of the substrate 13 due to lack of the blocking portion; however, it doesn't has a significant effect on the resultant dynamic imbalance, which indicates the vibration level of a rotating optical disc. The coating material moving away from the center of the substrate 13 will be confined within the material accommodating space having a L-shaped cross-section. In the case of two blocking portions, the blocking portion of the restricting section 2 near the center of the optical disc substrate 13 directs the coating material to two routes after coming in contact therewith. A small portion of the coating material in one route flows towards the supporting portion (not shown) of the optical disc substrate 13, and the rest portion of the coating material in the other route moves away from the supporting portion along the lower edge of the coating section 1 until it is stopped by the inner periphery of the other blocking portion. In this way, the distribution of the coating material can be confined within a desirable width. The excess coating material is kept in the U-shaped cross-sectional material accommodating space of the tool for coating an optical disc 11.

Subsequently, the tool for coating an optical disc 11 gradually ascends away from the rotating optical disc substrate 13, whereby the coating material in the material accommodating space of the tool for an optical disc 11 is spread and distributed on the optical disc substrate 13. As a result, the optical disc substrate 13 is gradually and evenly thickened with a layer of the coating material while the coating material kept in the material accommodating space lessens. When the layer of the coating material reaches a desirable thickness, the tool for coating an optical disc 11 stops ascending and works the layer of the coating material to a uniform thickness, forming an annular coating layer with a desirable width as marked by dotted lines S of FIG. 2 (Step 24).

Compared with other conventional methods for coating optical discs, the method of the invention is suitable for a highly viscous coating material with a viscosity over 1000 cps to form a coating layer having a thickness greater than 0.1 mm on an optical disc substrate. The width of an annular coating layer formed on the optical disc substrate 13 using this method is controllable by the material accommodating space, which confines the spread coating material to the width thereof and keeps the excess coating material therein to prevent wastage of the coating material. The material accommodating space is composed by the coating section 1 (scraper structure) and the restricting section 2. Moreover, the rotation speed of the optical disc substrate 13 can be set as required, for example, it can be rotated at a speed less than 100 rpm, and thus this method is also suitable for working with substrate materials that can be rotated only at a low rotation speed.

Another embodiment of the invention includes equipment for coating an optical disc and a similar method for coating an optical disc similar to the aforementioned embodiment, but with a difference in the coating method. The difference is that the optical disc substrate 13 is still and the mechanical arm 12, besides controlling the movement of the tool for coating an optical disc 11, moves along a circular track in a direction marked by Arrow B of FIG. 2. The radius of the circular track can be adjusted through the operation of the mechanical arm 12, to determine where the coating material is to be distributed and spread on the optical disc substrate 13. Therefore, even with the optical disc substrate 13 being still, the coating material can be spread on the optical disc substrate 13 to form an annular coating area with desirable width. Moreover, the rotation speed of the tool for coating an optical disc 11 can be set according to needs, for example, it can be rotated at a speed less than 100 rpm, and thus this method is also suitable for working with substrate materials that can be rotated only at a low rotation speed.

According to another embodiment of the invention, the method for coating an optical disc includes the optical disc substrate 13 rotating in a direction marked by Arrow A of FIG. 2 while the tool for coating an optical disc 11 rotates in a direction marked by Arrow B of FIG. 2. The coating material is thereby spread on the optical disc substrate 13 to form an annular coating area with desirable width. The aforementioned effects and advantages are achieved too.

According to another embodiment of the invention, the material-loading device 14 is absent and instead, an inlet is provided at the accommodating space of the tool for coating an optical disc 11. Consequentially, the tool for coating an optical disc 11 is capable of loading material. The amount of material to be loaded is predetermined by the size of the coating area that is needed to form the coating layer and thus the coating material is not wasted.

The tool for coating an optical disc and the method for coating an optical disc according to the invention as described above solve some existing problems in the conventional tools and methods for coating optical discs. Dynamic imbalance, which is the vibration level of a rotating optical disc, of optical discs formed by the tool for coating an optical disc and the method according to an embodiment of the invention is measured to show the advantage of the invention. A testing kit is used to carry out this experiment. Each optical disc used for this experiment has a diameter of 120 mm, 1.2 C.C. of coating material, and an annular coating layer having a predetermined width of 33 mm and confined to the optical disc at radius 17 mm to 50 mm. The test result is shown in Table 1.

TABLE 1

Predetermined width of annular coating layer = 33 mm
Amount of coating material = 1.2 C.C.

| | Thickness of coating layer (mm) | | | | | | | | Dynamic Imbalance <0.01 |
|---|---|---|---|---|---|---|---|---|---|
| | At where the optical disc radius = 20 mm | | At where the optical disc radius = 35 mm | | At where the optical disc radius = 45 mm | | Entire optical disc | | |
| Optical disc No. | Max. | Min. | Max. | Min. | Max. | Min. | Max. | Min. | (g·m) |
| 1 | 0.173 | 0.132 | 0.187 | 0.165 | 0.178 | 0.120 | 0.187 | 0.120 | 0.00182 |
| 2 | 0.167 | 0.133 | 0.188 | 0.166 | 0.172 | 0.123 | 0.188 | 0.123 | 0.00167 |
| 3 | 0.164 | 0.144 | 0.188 | 0.168 | 0.167 | 0.133 | 0.188 | 0.133 | 0.00156 |
| 4 | 0.166 | 0.145 | 0.189 | 0.175 | 0.176 | 0.125 | 0.189 | 0.125 | 0.00171 |

According to regular standard specification for optical discs, the standard dynamic imbalance of a 120 mm optical disc should not exceed 0.010 g·m; the lower the value of dynamic imbalance is, the smaller the vibration is, and the more stable the optical disc is during rotation. The primary cause for vibration during rotation is the unevenness of the coating layer. Therefore, the more flat the coating layer is, the smaller the vibration will be, and so the lower the dynamic imbalance will be.

As shown in Table 1, for optical disc No. 1, the maximum coating layer thickness at radius 20 mm is 0.173 mm and the minimum thickness is 0.132 mm; the maximum and the minimum thickness of the coating layer at radius 35 mm are respectively 0.187 mm and 0.165 mm; the coating layer at radius 45 mm has a maximum thickness of 0.178 mm and a minimum thickness of 0.120 mm; and for the entire No. 1 optical disc, the maximum and minimum thickness of the coating layer are measured to be 0.187 mm and 0.120 mm, respectively, and at last the dynamic imbalance of the No. 1 optical disc is obtained to be 0.00182 g·m, which is far below the standard specification of 0.01 g·m.

The test results of optical disc No. 2 are: the maximum coating layer thickness at radius 20 mm is 0.167 mm and the minimum is 0.133 mm; the maximum and the minimum thickness of the coating layer at radius 35 mm are respectively 0.188 mm and 0.166 mm; the coating layer at radius 45 mm has a maximum thickness of 0.172 mm and a minimum thickness of 0.123 mm; and for the entire No. 2 optical disc, the maximum and minimum thickness of the coating layer are measured to be 0.188 mm and 0.123 mm, respectively, and at last the dynamic imbalance of the No. 2 optical disc is obtained to be 0.00167 g·m, which is far below the standard specification of 0.01 g·m.

Optical disc No. 3 is tested, wherein the maximum coating layer thickness at radius 20 mm is 0.164 mm and the minimum is 0.144 mm; the maximum and the minimum thickness of the coating layer at radius 35 mm are respectively 0.188 mm and 0.168 mm; the coating layer at radius 45 mm has a maximum thickness of 0.167 mm and a minimum thickness of 0.133 mm; and for the entire No. 3 optical disc, the maximum and minimum thickness of the coating layer are measured to be 0.188 mm and 0.133 mm, respectively, and at last the dynamic imbalance of the No. 3 optical disc is obtained to be 0.00156 g·m, which is far below the standard specification of 0.01 g·m.

Results from testing optical disc No. 4 are: the maximum coating layer thickness at radius 20 mm is 0.166 mm and the minimum is 0.145 mm; the maximum and the minimum coating layer thickness at radius 35 mm are respectively 0.189 mm and 0.175 mm; the coating layer at radius 45 mm has a maximum thickness of 0.176 mm and a minimum thickness of 0.125 mm; and for the entire No. 4 optical disc, the maximum and minimum thickness of the coating layer are measured to be 0.189 mm and 0.125 mm, respectively, and at last the dynamic imbalance of the No. 4 optical disc is obtained to be 0.00171 g·m, which is far below the standard specification of 0.01 g·m.

From the above data, it can be observed that, among the four optical discs tested, the optical disc having a coating layer with smaller variance in thickness has a smaller dynamic imbalance. In other words, the optical disc having a more flat coating layer vibrates less during rotation. Each of the aforementioned optical discs has a dynamic imbalance that is far smaller than the standard specification 0.010 g·m and a tiny thickness variance of coating layer. Thus, an optical disc formed by the tool for coating an optical disc and the method for coating an optical disc of the invention can achieve the stability that satisfies the standard specification for optical discs and a flat coating layer.

In yet another embodiment, a method for fabricating an optical disc of the invention includes: fabricating an annular substrate, the annular substrate having a supporting portion and a recording portion surrounding the supporting portion, wherein the thickness of the supporting portion is greater than the thickness of the recording portion and the recording portion has a recording surface; forming a coating layer on the recording surface, for recording data; and forming a damping layer on the coating layer for shortening the response time to vibration of the annular substrate.

When using the tool for coating an optical disc, the method for coating an optical disc, and the method for fabricating an optical disc of the invention, the width of the material accommodating space of the tool for coating an optical disc can be designated as required, thereby specifying the width of the damping layer. In addition, in the coating operation, by controlling the position of the tool for coating an optical disc with respect to the annular substrate, the position of the annular coating layer on the annular substrate can be adjusted.

Furthermore, the restricting section comprising two blocking portions can direct the coating material to two routes. A small portion of the coating material in one route moves towards the center of the annular substrate and then comes into contact with, if provided, the supporting portion of the annular substrate. The coating material in the other route moves along the edge of the coating section of the tool for coating an optical disc to form the damping layer. In this case, the damping layer communicates with the supporting portion via the small portion of the coating material in contact with the supporting portion. Since the supporting portion of the annular substrate is thicker, if the damping layer is in contact with the supporting portion, the structure of the optical disc formed thereby can be strengthened.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretations so as to encompass all such modifications and similar arrangements.

What is claimed is:

1. A method for coating an optical disc, comprising steps of:
    providing a tool for coating an optical disc, the tool comprising:
        a coating section having an upper surface and a coating surface for spreading coating material;
        a restricting section for defining a coating area; and
        a support section for supporting the coating section and the restricting section, the support section being coupled to the coating section;
        wherein a first side of the restricting section is coupled to the coating section while the side opposite to the first side is left free so that the coating section and the restricting section collectively form a structure having an open cross-section and defining a material accommodating space;
    placing coating material on an optical disc substrate;
    positioning the coating surface of the coating section of the tool for coating an optical disc to be parallel to a to-be-coated surface of the optical disc substrate;
    generating a relative circular motion between the tool for coating an optical disc and the optical disc substrate to spread the coating material on the optical disc substrate by use of the tool for coating an optical disc; and
    forming an annular coating layer on the optical disc substrate,
    wherein the restricting section includes a first blocking portion having a first outside surface, the first blocking portion is coupled to the coating section in a width direction at one side farther away from the center of a to-be-coated optical disc substrate and extends by a desirable length in a downward direction substantially perpendicular to the upper surface of the coating section, and the first outside surface and the coating surface of the coating section are coplanar,
    wherein the structure formed collectively by the coating section and the restricting section has an L-shaped cross-section.

2. The method as described in claim 1, wherein the optical disc substrate has a central supporting portion.

3. The method as described in claim 1, wherein the placing step is performed by the tool for coating an optical disc including a material-loading device.

4. The method as described in claim 1, wherein the viscosity of the coating material is greater than 10000 cps.

5. The method as described in claim 1, wherein in the generating step, the relative circular motion is caused by rotating the optical disc substrate, moving the tool for coating an optical disc along a circular track at a speed less than 100 rpm, or the combination of both.

6. The method as described in claim 1, wherein the coating layer has a thickness greater than 0.1 mm.

7. The method as described in claim 2, wherein, in the generating step, the restricting section of the tool for coating an optical disc directs the coating material so that a part of the coating material comes into contact with the central supporting portion of the optical disc substrate.

8. The method as described in claim 1, wherein the optical disc on which the coating layer is formed by the coating method has a dynamic imbalance less than 0.010 g·m.

9. A method for fabricating an optical disc, comprising steps of:
    fabricating an annular substrate, the annular substrate having a central supporting portion and a recording portion surrounding the central supporting portion, wherein the thickness of the central supporting portion is greater than the thickness of the recording portion, and the recording portion has a recording surface;
    forming a coating layer on the recording surface; and
    forming a damping layer on the coating layer according to a method for coating an optical disc as described in claim 1.

10. The method as described in claim 1, wherein the first outside surface and the coating surface of the coating section are inclined with respect to the upper surface of the coating section.

* * * * *